US009274167B2

(12) United States Patent
Huang et al.

(10) Patent No.: US 9,274,167 B2
(45) Date of Patent: Mar. 1, 2016

(54) CHIP-TO-CHIP SIGNAL TRANSMISSION SYSTEM AND CHIP-TO-CHIP CAPACITIVE COUPLING TRANSMISSION CIRCUIT

(71) Applicant: I-SHOU UNIVERSITY, Kaohsiung (TW)

(72) Inventors: Yu-Jung Huang, Kaohsiung (TW); Ming-Kun Chen, Kaohsiung (TW); Kai-Jen Liu, Kaohsiung (TW)

(73) Assignee: I-SHOU UNIVERSITY, Kaohsiung (TW)

( * ) Notice: Subject to any disclaimer, the term of this patent is extended or adjusted under 35 U.S.C. 154(b) by 385 days.

(21) Appl. No.: 13/904,032

(22) Filed: May 29, 2013

(65) Prior Publication Data
US 2014/0210496 A1     Jul. 31, 2014

(30) Foreign Application Priority Data

Jan. 25, 2013   (TW) .............................. 102102997 A

(51) Int. Cl.
  *G01R 31/312* (2006.01)
  *H04B 5/00* (2006.01)
  *H04B 17/14* (2015.01)

(52) U.S. Cl.
  CPC ............ *G01R 31/312* (2013.01); *H04B 5/0012* (2013.01); *H04B 17/14* (2015.01)

(58) Field of Classification Search
  USPC ............... 324/762.02, 762.01, 750.16, 750.3, 324/762.03, 762.05, 537, 750.01, 754.28, 324/756.01, 762.06; 375/295, 316, 224; 257/E23.01, E21.705, 777, E21.002, 257/E21.499, E23.144, E25.01, 528; 327/109, 564; 438/17, 129, 14; 333/103, 24 C
  See application file for complete search history.

(56) References Cited

U.S. PATENT DOCUMENTS

| 2006/0181301 | A1* | 8/2006 | Neaves et al. ................. | 324/765 |
| 2007/0029646 | A1* | 2/2007 | Voldman ........................ | 257/662 |
| 2010/0115349 | A1* | 5/2010 | Ho et al. ........................ | 714/700 |
| 2012/0262231 | A1* | 10/2012 | Scandiuzzo et al. ............ | 330/69 |

FOREIGN PATENT DOCUMENTS

TW          201205756           2/2012

OTHER PUBLICATIONS

Kai-Jen Liu, "Testable Design for AC-coupling Interconnection in High-Speed Serial Links Applications," Master's Thesis, Jul. 2012, Department of Electronic Engineering, I-Shou University, pp. 1-96 with an English abstract on p. 2.

* cited by examiner

*Primary Examiner* — Melissa Koval
*Assistant Examiner* — Nasima Monsur
(74) *Attorney, Agent, or Firm* — Jianq Chyun IP Office

(57) ABSTRACT

A chip-to-chip signal transmission system is provided, which includes a first chip, a second chip, and a dielectric layer. A signal transmission is performed between a transmitter of the first chip and a receiver of the second chip through a transmission-metal-pad unit and a receiving-metal-pad unit. The transmitter transmits a transmission-testing-coupling signal through the transmission-metal-pad unit according to a driving-testing signal when the transmitter receives the driving-testing signal. A first testing unit receives the transmission-testing-coupling signal and outputs a transmission-testing signal according to the transmission-testing-coupling signal. A second testing unit transmits a receiving-testing-coupling signal through the receiving-metal-pad unit according to the driving-testing signal when the second testing unit receives the driving-testing signal. The receiver receives the receiving-testing-coupling signal and outputs a receiving-testing signal according to the receiving-testing-coupling signal.

20 Claims, 5 Drawing Sheets

CHIP-TO-CHIP SIGNAL TRANSMISSION SYSTEM AND CHIP-TO-CHIP CAPACITIVE COUPLING TRANSMISSION CIRCUIT

CROSS-REFERENCE TO RELATED APPLICATION

This application claims the priority benefit of Taiwan application serial no. 102102997, filed on Jan. 25, 2013. The entirety of the above-mentioned patent application is hereby incorporated by reference herein and made a part of this specification.

BACKGROUND OF THE INVENTION

1. Field of the Invention

The invention relates to a capacitive coupling chip-to-chip signal transmission system and particularly relates to a capacitive coupling chip-to-chip signal transmission system and a chip-to-chip capacitive coupling transmission circuit capable of self testing.

2. Description of Related Art

With the development of miniaturization and decreasing production costs of electronic products, IC chip miniaturization and three-dimensional stack packaging have become an important trend in the development of semiconductor technology. 3D die stacking is an emerging technology that reduces the wire length both within and across dies in a system. With 3D die stacking, dies of different types can be stacked with a high bandwidth, low latency, and low power interface. 3D (three-dimensional) IC stack technology will be an effective solution to the problems of serious delay and power consumption. 3D ICs promise "more than Moore" integration by packing a great deal of functionality into small form factors, while improving performance and reducing costs.

In the current technology for integrating 3D IC, the fabrication of vertical conduction between chips is a new technique for achieving chip interconnection. The methods for integrating the signal transmission between stack chips include wire bonding, micro-bumps, through silicon via (TSV), and contactless interconnect such as capacitive-coupling, and inductive-coupling. The 3D stack techniques not only achieve high I/O density but also satisfy the demand for high-speed transmission and low power consumption.

Among these techniques, the most common one is TSV technology. Major semiconductor manufacturers in the world are investing a lot in developing through silicon via (TSV) fabrication technology for 3D IC in an attempt to package various digital logics, memories, or analog chip circuit into one single package, so as to greatly improve system functionality and speed. Different from the conventional IC package bonding and salient point stacking technology, TSV technology achieves the greatest density of stacking chips in three-dimensional directions, has the smallest size, improves the speed of the devices, reduces signal delay, and suppresses power consumption. Therefore, TSV is the key technology for 3D IC integration. The more the stack layers are, the more powerful the functions of IC become.

However, TSV 3D IC faces technical problems related to wafer thinning, chip stack, and heat dissipation processing. In addition, as TSV 3D IC technology continues to advance and be applied to actual fabrication, more problems about details of the front-end and back-end IC fabrication processes are revealed. The major disadvantages thereof are high production costs and low yield rate. For example, the silicon substrates may be affected by the mechanical force of drilling, which lowers the yield rate of the chips.

In addition, for non-contact capacitive coupling or capacitive coupling chip communication, the main concept of AC coupled interconnect (ACCI) is that connection of DC electrical components is not required in case of high-frequency transmission, and the signal transmission can be completed simply by a good communication link. Capacitive coupling interconnection is a wireless chip-to-chip connection technology, and this technology utilizes capacitive coupling to transit signals from one chip to a neighboring chip. Moreover, the circuit design for a capacitive coupling chip transmission terminal is simpler and only requires sufficient driving and small coupling capacitive area. Thus, it is suitable for the integration of multiple chips. Capacitive coupling interconnection has advantages such as smaller area usage, higher I/O density, lower delay, lower power consumption of chip-to-chip I/O capability, and high performance, make it possible for forming a 3D package with high performance and economic efficiency.

However, for AC coupling interconnection, the circuit design of package is very important. The circuit and transmission method of AC coupling interconnection are related to the recovery accuracy of the transmitted signals. Thus, design issues such as I/O signal integrity needs to be overcome. On the other hand, for capacitive coupling interconnection technology, a testing method thereof cannot be achieved in the conventional 3D IC technology yet.

SUMMARY OF THE INVENTION

Accordingly, the invention provides a chip-to-chip signal transmission system and a chip-to-chip capacitive coupling transmission circuit for improving communication quality of capacitive coupling connection between chips in a three-dimensional integrated circuit, thereby achieving chip self testing.

The invention provides a chip-to-chip signal transmission system, which includes a first chip, a second chip, and a dielectric layer. The first chip includes a transmission-metal-pad unit, a transmitter, and a first testing unit. The transmission-metal-pad unit is disposed on a surface of the first chip. The transmitter is coupled to the transmission-metal-pad unit for receiving input data and outputting a chip-to-chip coupling signal through the transmission-metal-pad unit. The first testing unit includes a transmission-testing-metal-pad unit and a receiving-testing circuit, and the transmission-testing-metal-pad unit is coupled to the transmission-metal-pad unit. The second chip is disposed above the first chip and includes a receiving-metal-pad unit, a receiver, and a second testing unit. The receiving-metal-pad unit is disposed on a surface of the second chip corresponding to the transmission-metal-pad unit. The receiver is coupled to the receiving-metal-pad unit, receives a chip-to-chip coupling signal through the receiving-metal-pad unit, and outputs an output signal. The second testing unit includes a receiving-testing-metal-pad unit and a driving-testing circuit, and the receiving-testing-metal-pad unit is coupled to the receiving-metal-pad unit. The dielectric layer is disposed between the first chip and the second chip. When the transmitter receives a driving-testing signal, the transmitter transmits a transmission-testing-coupling signal through the transmission-testing-metal-pad unit according to the driving-testing signal, the first testing unit receives the transmission-testing-coupling signal through the transmission-metal-pad unit, and the first testing unit outputs a transmission-testing signal according to the transmission-testing-coupling signal. When the second testing unit receives the driving-testing signal, the second testing unit transmits a receiving-testing-coupling signal through the receiving-testing-metal-pad unit according to the driving-testing signal, the receiver receives the receiving-testing-coupling signal through the receiving-metal-pad unit, and the receiver outputs a receiving-testing signal according to the receiving-testing-coupling signal.

The invention provides a chip-to-chip capacitive coupling transmission circuit that is disposed above a chip and includes a transmission-metal-pad unit, a transmitter, a receiving-metal-pad unit, a receiver, a first testing unit, and a second testing unit. The transmission-metal-pad unit is disposed on a surface of the chip. The transmitter is coupled to the transmission-metal-pad unit for receiving input data and outputting a first chip-to-chip coupling signal through the transmission-metal-pad unit. The receiving-metal-pad unit is disposed on the surface of the chip. The receiver is coupled to the receiving-metal-pad unit, receives a second chip-to-chip coupling signal through the receiving-metal-pad unit, and outputs an output signal. The first testing unit includes a transmission-testing-metal-pad unit and a receiving-testing circuit, and the transmission-testing-metal-pad unit is coupled to the transmission-metal-pad unit. The second testing unit includes a receiving-testing-metal-pad unit and a receiving-testing circuit, and the receiving-testing-metal-pad unit is coupled to the receiving-metal-pad unit. When the transmitter receives a driving-testing signal, the transmitter transmits a transmission-testing-coupling signal through the transmission-metal-pad unit according to the driving-testing signal, the first testing unit receives the transmission-testing-coupling signal through the transmission-testing-metal-pad unit, and the first testing unit outputs a transmission-testing signal according to the transmission-testing-coupling signal. When the second testing unit receives the driving-testing signal, the second testing unit transmits a receiving-testing-coupling signal through the receiving-metal-pad unit according to the driving-testing signal, the receiver receives the receiving-testing-coupling signal through the receiving-testing-metal-pad unit, and the receiver outputs a receiving-testing signal according to the receiving-testing-coupling signal.

Based on the above, the chip-to-chip signal transmission system and the chip-to-chip capacitive coupling transmission circuit of the invention perform communication between the chips by means of capacitive coupling, and the circuit design thereof improves communication quality of the capacitive coupling connection between the chips in the three-dimensional integrated circuit. In addition, the invention achieves the function of chip self testing by disposing the testing metal pad and testing circuit, so as to increase the implementability of the chip-to-chip capacitive coupling transmission circuit and further to prevent problems of TSV technology, such as high costs and low yield rate.

To make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
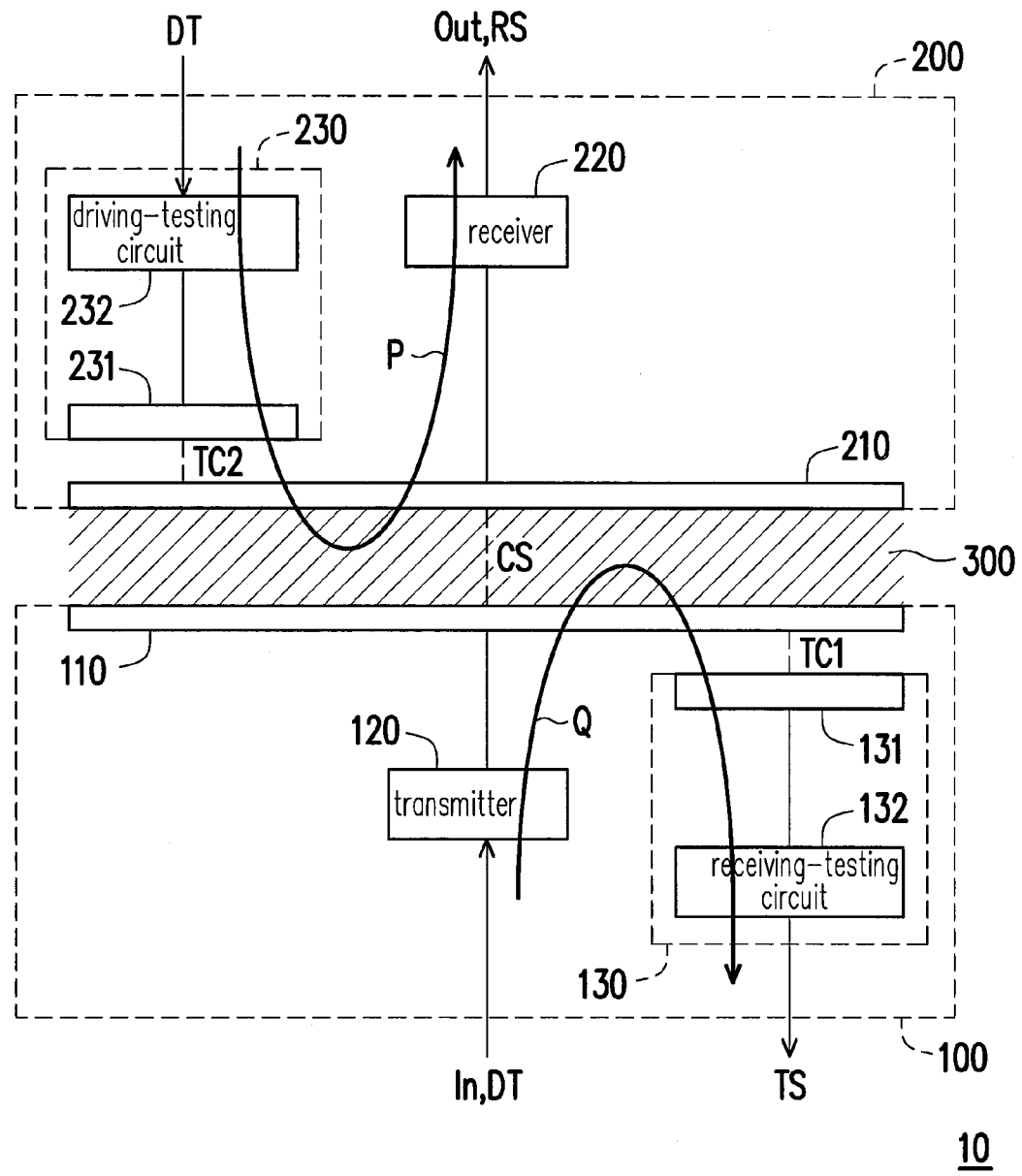
FIG. 1 is a schematic structural diagram illustrating a chip-to-chip signal transmission system according to an embodiment of the invention.

A chip-to-chip signal transmission system is disclosed hereinafter. FIG. 1 is a schematic structural diagram illustrating the chip-to-chip signal transmission system according to an embodiment of the invention. Referring to FIG. 1, a chip-to-chip signal transmission system 10 includes a chip 100 and a chip 200, and a dielectric layer 300 is disposed between the chip 100 and the chip 200. The chip 100 includes a transmission-metal-pad unit 110, a transmitter 120, and a testing unit 130. Specifically, the transmission-metal-pad unit 110 is disposed on a surface of the chip 100. The transmitter 120 is coupled to the transmission-metal-pad unit 110 for receiving input data In and outputting a chip-to-chip coupling signal CS through the transmission-metal-pad unit 110. The testing unit 130 includes a transmission-testing-metal-pad unit 131 and a receiving-testing circuit 132, and the transmission-testing-metal-pad unit 131 is coupled to the transmission-metal-pad unit 110.

The chip 200 is disposed above the chip 100 and includes a receiving-metal-pad unit 210, a receiver 220, and a testing unit 230. The receiving-metal-pad unit 210 is disposed on a surface of the chip 200 corresponding to the transmission-metal-pad unit 110. The receiver 220 is coupled to the receiving-metal-pad unit 210 for receiving the chip-to-chip coupling signal CS through the receiving-metal-pad unit 210 and outputting an output signal Out. The testing unit 230 includes a receiving-testing-metal-pad unit 231 and a driving-testing circuit 232, and the receiving-testing-metal-pad unit 231 is coupled to the receiving-metal-pad unit 210. That is to say, the chips 100 and 200 are stacked face to face. Moreover, the transmission-metal-pad unit 110 and the receiving-metal-pad unit 210 on the surfaces of the chips 100 and 200 are respectively used as capacitive electrodes, so as to achieve signal transmission between the transmitter 120 and the receiver 220 by a capacitive coupling effect.

In other words, when the input data In is inputted via the transmitter 120, the chip 100 utilizes the transmission-metal-pad unit 110 as the capacitive electrode and transmits the input data In from the chip 100 to the chip 200 by means of capacitive coupling. In addition, when the transmitter 120 receives a driving-testing signal DT, the transmitter 120 transmits a transmission-testing-coupling signal TC1 through the transmission-metal-pad unit 110 according to the driving-testing signal DT. A receiving-testing circuit 132 receives the transmission-testing-coupling signal TC1 through the transmission-testing-metal-pad unit 131 and outputs a transmission-testing signal TS according to the transmission-testing-coupling signal TC1.

That is to say, when a testing mode is actuated, the transmitter 120 receives the driving-testing signal DT and transmits the transmission-testing-coupling signal TC1 through the transmission-metal-pad unit 110 according to the driving-testing signal DT. Because of the capacitive coupling effect generated between the transmission-metal-pad unit 110 and the transmission-testing-metal-pad unit 131, the receiving-testing circuit 132 receives the transmission-testing-coupling signal TC1 from the transmission-testing-metal-pad unit 131 and outputs the transmission-testing signal TS according to the transmission-testing-coupling signal TC1. In other words, the transmitter 120 transmits the received signal back to the receiving-testing circuit 132 by capacitive coupling via a transmission path Q. The transmission path Q is composed of the transmission-metal-pad unit 110 and the transmission-testing-metal-pad unit 131. Furthermore, an external device, e.g. oscilloscope, may be used to retrieve and analyze the transmission-testing signal TS to obtain a signal characteristic of actual transmission after capacitive coupling, thereby testing the communication efficiency between the chips.

In addition, the chip 200 utilizes the receiving-metal-pad unit 210 as the capacitive electrode. An internal circuit of the chip system 10 is operated by capacitive coupling, and the chip 200 receives the chip-to-chip coupling signal CS from the chip 100. Furthermore, when the driving-testing circuit 232 receives the driving-testing signal DT, the driving-testing circuit 232 transmits a receiving-testing-coupling signal TC2 through the receiving-testing-metal-pad unit 231 according to the driving-testing signal DT, the receiver 220 receives the receiving-testing-coupling signal TC2 through the receiving-metal-pad unit 210 and outputs a receiving-testing signal RS according to the receiving-testing-coupling signal TC2.

That is to say, when the testing mode is actuated, the driving-testing circuit 232 receives the driving-testing signal DT and transmits the receiving-testing-coupling signal TC2 through the receiving-metal-pad unit 210. Because of the capacitive coupling effect generated between the receiving-metal-pad unit 210 and the receiving-testing-metal-pad unit 231, the receiver 220 receives the receiving-testing-coupling signal TC2 from the receiving-metal-pad unit 210 and outputs the receiving-testing signal RS according to the receiving-testing-coupling signal TC2. To be more specific, the driving-testing circuit 232 transmits the received signal back to the receiver 220 after capacitive coupling via a transmission path P. The transmission path P is composed of the receiving-metal-pad unit 210 and the receiving-testing-metal-pad unit 231. Through retrieving and analyzing the receiving-testing signal RS, the signal characteristic of actual transmission after capacitive coupling is obtained to test the communication efficiency and performance between the chips.

According to the invention, in order to further reduce power consumption and increase data transmission rate, the circuit of the receiver may be designed as a differential double-pulse transmission circuit and a differential double-pulse receiving circuit. For circuits that are connected by capacitive coupling, the circuit designs of the transmitter and the receiver are important. When designing the circuits of the transmitter and the receiver, it is required to consider how to prevent noise interference and signal attenuation that may occur when signals are transmitted by capacitive coupling through metal pads, so as to maintain integrity of signal transmission.

Figure 2:
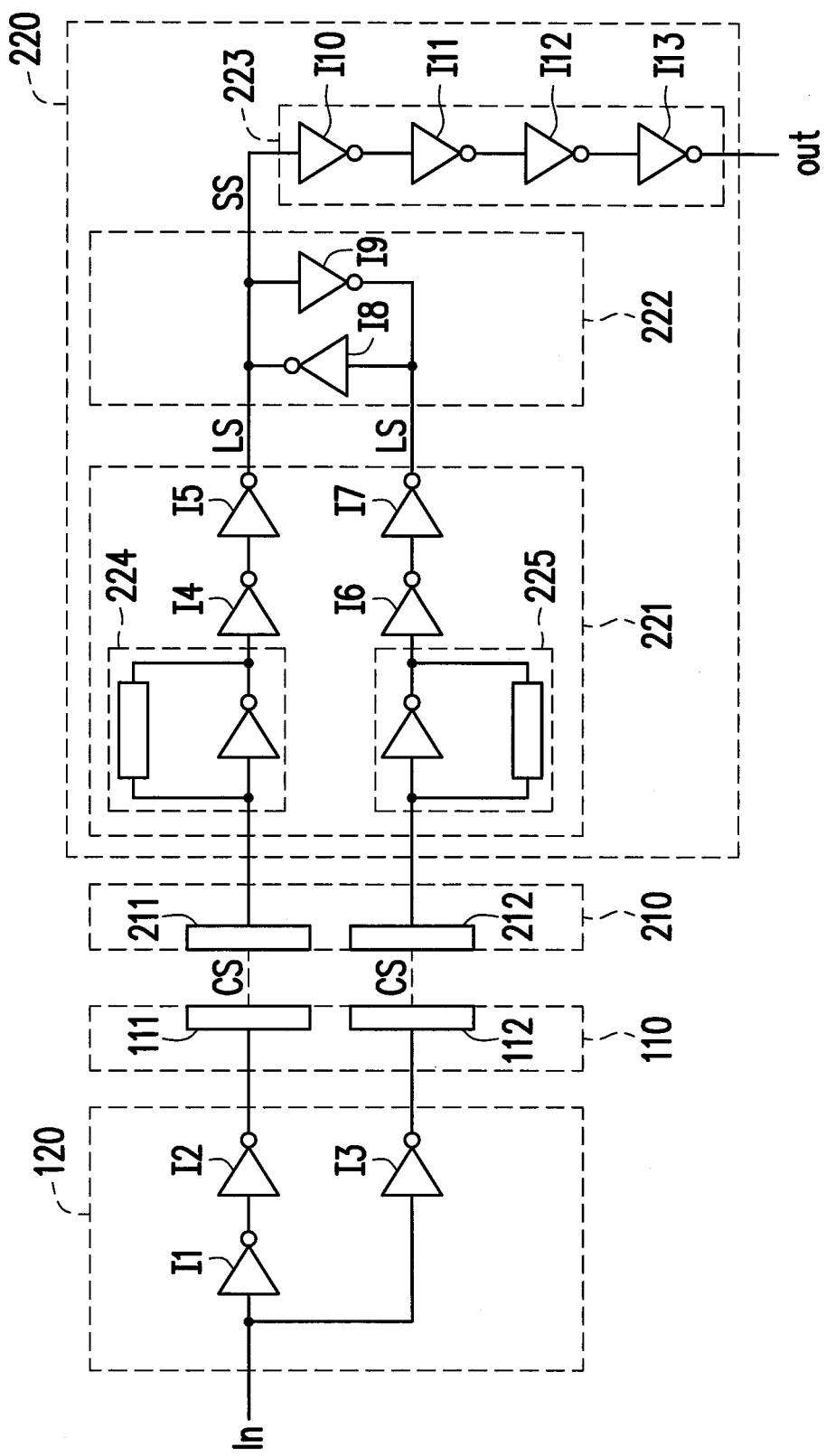
FIG. 2 is a circuit diagram illustrating a transmitter and a receiver in a chip-to-chip signal transmission system according to an embodiment of the invention.

Accordingly, FIG. 2 is a circuit diagram illustrating a transmitter and a receiver in a chip-to-chip signal transmission system according to an embodiment of the invention, wherein the transmitter and the receiver are exemplary embodiments of the transmitter 120 and the receiver 130 of FIG. 1. Referring to FIG. 1 and FIG. 2, the transmission-metal-pad unit 110 includes a transmission metal pad 111 and a transmission metal pad 112. The circuit of the transmitter 120 includes three inverters I1-I3 for respectively converting the input data In into a set of phase-inverted signals and transmitting the chip-to-chip coupling signal CS to the receiver 220 through the transmission-metal-pad unit 110 by capacitive coupling. The inverters I1-I3 also serve as a buffer for increasing the amplitude intensity of the phase-inverted signals and the chip-to-chip coupling signal CS.

An input terminal of the inverter I1 receives the input data In. An input terminal of the inverter I2 is coupled to an output terminal of the inverter I1. An output terminal of the inverter I2 is coupled to the transmission metal pad 111 and outputs the chip-to-chip coupling signal CS through the transmission metal pad 111. An input terminal of the inverter I3 receives the input data In. An output terminal of the inverter I3 is coupled to the transmission metal pad 112 and outputs the chip-to-chip coupling signal CS through the transmission metal pad 112. The capacitive coupling chip transmitter has simpler circuit design, such that the chip-to-chip coupling signal CS only requires sufficient driving. In addition, the capacitive coupling chip transmitter requires smaller coupling capacitive area and thus is very suitable for integration of multiple chips.

Furthermore, the receiving-metal-pad unit 210 includes a receiving metal pad 211 and a receiving metal pad 212 that respectively correspond to the transmission metal pad 111 and the transmission metal pad 112. A circuit of the receiver 220 includes an amplifier circuit 221, a double-phase-to-single-phase circuit 222, and a buffer circuit 223. Specifically, the amplifier circuit 221 is coupled to the receiving metal pad 211 and the receiving metal pad 212 and receives the chip-to-chip coupling signal CS through the receiving metal pad 211 and the receiving metal pad 212 to output an amplified coupling signal LS. The double-phase-to-single-phase circuit 222 is coupled to the amplifier circuit 221 and receives the amplified coupling signal LS and outputs a single-phase signal SS. The buffer circuit 223 is coupled to the double-phase-to-single-phase circuit 222 and receives the single-phase, signal SS and outputs an output signal Out. Accordingly, the receiver 220 receives the signal, i.e. the chip-to-chip coupling signal CS, transmitted by the transmitter 120 by capacitive coupling.

It is worth mentioning that the circuit design of the receiver 220 is rather related to the recovery accuracy of the received signal. Thus, in an embodiment of the invention, the inverters in the circuit of the receiver 220 are embodied using complementary metal-oxide-semiconductor (CMOS) inverters (referred to as CMOS inverters hereinafter). The CMOS inverters have the characteristics of high input impedance and high feedback impedance and therefore can be used as analog signal amplifiers. When an input voltage for the CMOS inverters is biased to VDD/2, the CMOS inverters become a PUSH-PULL inverting amplifier that meets the requirements of a non-contact receiving circuit.

Accordingly, the amplifier circuit 221 includes active load circuits 224 and 225 and inverters I4-I7. The active load circuit 224 is coupled to the receiving metal pad 211, and the active load circuit 225 is coupled to the receiving metal pad 212. An input terminal of the inverter I4 is coupled to the active load circuit 224, and an input terminal of the inverter I5 is coupled to an output terminal of the inverter I4. An input terminal of the inverter I6 is coupled to the active load circuit 225, and an input terminal of the inverter I7 is coupled to an output terminal of the inverter I6.

In this embodiment, because the chip-to-chip coupling signal CS received by the capacitive coupling effect becomes much weaker after being transmitted, the amplifier circuit 221 of a first phase first uses the active load circuit 224 to adjust a loop gain thereof. For example, the active load circuit 224 may be a transmission gate including a transistor. The transmission gate amplifies the chip-to-chip coupling signal CS received by capacitive coupling and pulls back the signal with a second-level inverter. Because the receiver 220 as a whole may be deemed as a signal amplifier, the receiver 220 may use the transmission gate therein as an active load to adjust the loop gain thereof. And, because a following differential amplifier circuit has a characteristic of high common-mode rejection ratio (CMRR), the receiver 220 has better anti-noise and anti-interference abilities and helps to maintain the integrity of signal transmission.

Moreover, in this embodiment, the double-phase-to-single-phase circuit 222 is a latch circuit for converting two amplified coupling signals LS to a single-ended output. The double-phase-to-single-phase circuit 222 includes inverters I8 and I9. An input terminal of the inverter I8 is coupled to the output terminal of the inverter I7, and an output terminal of the inverter I8 is coupled to the output terminal of the inverter I5. An input terminal of the inverter I9 is coupled to the output terminal of the inverter I5, and an output terminal of the inverter I9 is coupled to the output terminal of the inverter I7. In another embodiment of the invention, the double-phase-to-single-phase circuit 222 may be a cross-coupled latch circuit for improving the problem that a transfer error may occur between two ends of the circuit of the receiver 220 due to inconsistent delay of the transmitter 120, which affects the integrity of an output waveform.

The buffer circuit 223 includes a plurality of inverters I10-I13, wherein the inverters I10-I13 are connected in series. The buffer circuit 223 is used for driving and amplifying the single-phase signal SS. It should be noted that, although the buffer circuit 223 of this embodiment includes the inverters I10-I13, the scope of the invention is not limited thereto. In this embodiment, the circuit of the receiver 220 may use the amplifier circuit 221, composed of a PUSH-PULL CMOS and the transmission gate, to amplify the chip-to-chip coupling signal that goes through capacitive coupling, and then use the double-phase-to-single-phase circuit 222 to convert the amplified coupling signal LS to the single-phase signal SS and use the buffer circuit to drive and amplify the single-phase signal SS to generate the output signal Out.

Accordingly, the signal transmission between the chips 100 and 200 is achieved by the transmitter 120 and the receiver 220 of the invention. Further, according to the above descriptions of the circuits of the transmitter 120 and the receiver 220, it is known that the design of the transmitter 120 and the receiver 220 of the invention has the characteristics of simple circuit, circuit wiring area not larger than the coupling pad, and fast operation speed. In addition, in order to test chips connected by capacitive coupling, the invention further provides a chip-to-chip signal transmission system capable of self testing.

Figure 3:
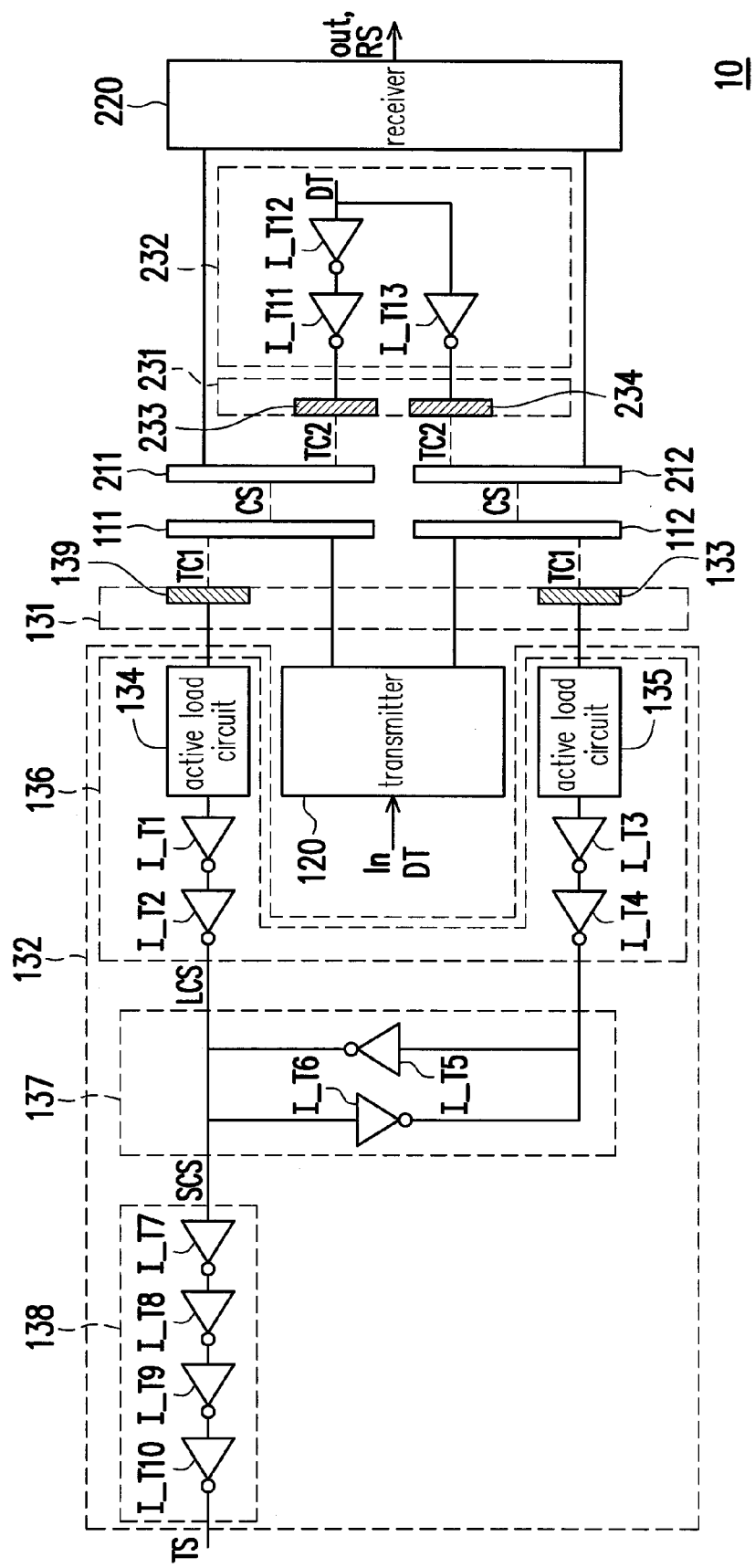
FIG. 3 is a circuit diagram illustrating the entirety of a chip-to-chip signal transmission system according to an embodiment of the invention.

Accordingly, FIG. 3 is a circuit diagram illustrating the entirety of the chip-to-chip signal transmission system according to an embodiment of the invention, which corresponds to the embodiment of FIG. 1. Referring to FIG. 1 and FIG. 3, the transmission-testing-metal-pad unit 131 includes a transmission-testing-metal pad 139 and a transmission-testing-metal pad 133. The receiving-testing circuit 132 includes an amplifier circuit 136, a double-phase-to-single-phase circuit 137, and a buffer circuit 138. The amplifier circuit 136 is coupled to the transmission-testing-metal pad 139 and the transmission-testing-metal pad 133, receives the transmission-testing-coupling signal TC1 through the transmission-testing-metal pad 139 and the transmission-testing-metal pad 133, and amplifies the transmission-testing-coupling signal TC1 to obtain and output an output amplified transmission-testing-coupling signal LCS. The double-phase-to-single-phase circuit 137 is coupled to the amplifier circuit 136, receives the amplified transmission-testing-coupling signal LCS, and outputs a single-phase-testing signal SCS. The buffer circuit 138 is coupled to the double-phase-to-single-phase circuit 137, receives the single-phase-testing signal SCS, and outputs the transmission-testing signal TS.

The amplifier circuit 136 of the receiving-testing circuit 132 includes active load circuits 134 and 135 and inverters I_T1-I_T4. The active load circuit 134 is coupled to the transmission-testing-metal pad 139, and the active load circuit 135 is coupled to the transmission-testing-metal pad 133. An input terminal of the inverter I_T1 is coupled to the active load circuit 134, and an input terminal of the inverter I_T2 is coupled to an output terminal of the inverter I_T1. An input terminal of the inverter I_T3 is coupled to the active load circuit 135, and an input terminal of the inverter I_T4 is coupled to an output terminal of the inverter I_T3. The signal intensity becomes weaker after capacitive coupling. Therefore, the signal is amplified by the amplifier circuit 136 for sequential signal processing.

The double-phase-to-single-phase circuit 137 is a latch circuit for converting the double-phase amplified coupling signal LCS to a single-phase output. The double-phase-to-single-phase circuit 137 includes inverters I_T5 and I_T6. An input terminal of the inverter I_T5 is coupled to the output terminal of the inverter I_T4, and an output terminal of the inverter I_T5 is coupled to the output terminal of the inverter I_T2. An input terminal of the inverter I_T6 is coupled to the output terminal of the inverter I_T2, and an output terminal of the inverter I_T6 is coupled to the output terminal of the inverter I_T4. Additionally, in another embodiment of the invention, the double-phase-to-single-phase circuit 137 may be a cross-coupled latch circuit for improving the integrity of an output waveform.

The buffer circuit 138 includes a plurality of inverters I_T7-I_T10, wherein the inverters I_T7-I_T10 are connected in series. The buffer circuit 138 is used for driving and amplifying the single-phase-testing signal SCS to a waveform that can be measured. It should be noted that, although the buffer circuit 138 of this embodiment includes four inverters I_T7-I_T10, the scope of the invention is not limited thereto.

Moreover, it is known from the above descriptions that, in this embodiment, the receiving-testing circuit 132 and the receiver 220 have similar circuit structures and both receive signals outputted from the transmitter 120 by the capacitive coupling effect. More specifically, the transmitter 120 outputs the chip-to-chip coupling signal CS through the transmission metal pads 111 and 112, and the receiver 220 receives the chip-to-chip coupling signal CS through the receiving metal pads 211 and 212. When the testing mode is actuated, the transmitter 120 outputs the transmission-testing-coupling signal TC1 through the transmission metal pads 111 and 112, and the receiving-testing circuit 132 receives the transmission-testing-coupling signal TC1 through the transmission-testing-metal pads 139 and 133.

The receiving-testing-metal-pad unit 231 includes a receiving-testing-metal pad 233 and a receiving-testing-metal pad 234. The driving-testing circuit 232 includes inverters I_T11-I_T13, and an input terminal of the inverter I_T12 receives the driving-testing signal DT. An input terminal of the inverter I_T11 is coupled to an output terminal of the inverter I_T12. An output terminal of the inverter I_T11 is coupled to the receiving-testing-metal pad 233 and outputs the receiving-testing-coupling signal TC2 through the receiving metal pad 233. An input terminal of the inverter I_T13 receives the driving-testing signal DT. An output terminal of the inverter I_T13 is coupled to the transmission-testing-metal pad 234 and outputs the receiving-testing-coupling signal TC2 through the transmission metal pad 234.

It is known from the above descriptions that, in this embodiment, the driving-testing circuit 232 and the transmitter 120 have similar circuit structures and both transmit the signals to the receiver 220 by the capacitive coupling effect. More specifically, the transmitter 120 outputs the chip-to-chip coupling signal CS through the transmission metal pads 111 and 112, and the receiver 220 receives the chip-to-chip coupling signal CS through the receiving metal pads 211 and 212. When the testing mode is actuated, the driving-testing circuit 232 outputs the receiving-testing-coupling signal TC2 through the receiving-testing-metal pad 233 and the receiving-testing-metal pad 234, and the receiver 220 receives the receiving-testing-coupling signal TC2 through the receiving metal pads 211 and 212.

In other words, by disposing the transmission-testing-metal-pad units, the transmission-testing-metal-pad units and the transmission metal pads are able to perform signal transmission by capacitive coupling. Similarly, by disposing the receiving-testing-metal-pad units, the receiving-testing-metal-pad units and the receiving metal pads are able to perform signal transmission by capacitive coupling. Accordingly, the characteristics of the signals transmitted by the capacitive coupling effect can be tested using the aforementioned method, and the testing result is closer to the actual situation. Moreover, whether the signal transmission communication between the chips is normal can be determined based on the testing result.

Figure 4:
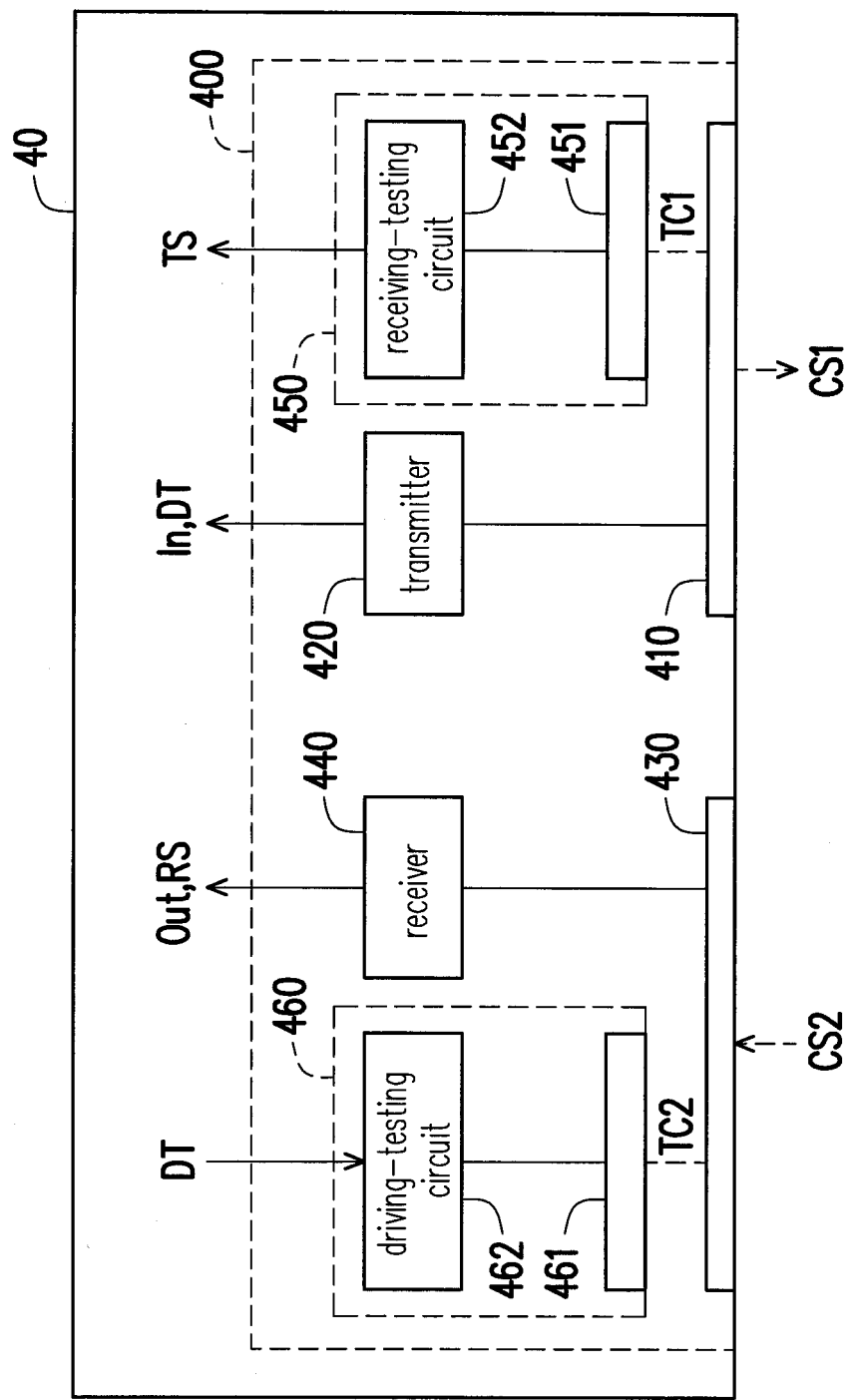
FIG. 4 is a block diagram illustrating a chip-to-chip capacitive coupling transmission circuit according to an embodiment of the invention.

FIG. 4 is a block diagram illustrating a chip-to-chip capacitive coupling transmission circuit according to an embodiment of the invention. Please refer to FIG. 4. The chip-to-chip capacitive coupling transmission circuit 400 is disposed above a chip 40 and includes a transmission-metal-pad unit 410, a transmitter 420, a receiving-metal-pad unit 430, a receiver 440, and testing units 450 and 460. The transmission-metal-pad unit 410 is disposed on a surface of the chip 40. The transmitter 420 is coupled to the transmission-metal-pad unit 410 for receiving input data In and outputting a chip-to-chip coupling signal CS1 through the transmission-metal-pad unit 410. The receiving-metal-pad unit 430 is disposed on the surface of the chip 40. The receiver 440 is coupled to the receiving-metal-pad unit 430, receives a chip-to-chip coupling signal CS2 through the receiving-metal-pad unit 430, and outputs an output signal Out. The testing unit 450 includes a transmission-testing-metal-pad unit 451 and a testing circuit 452, and the transmission-testing-metal-pad unit 451 is coupled to the transmission-metal-pad unit 410. The testing unit 460 includes a receiving-testing-metal-pad unit 461 and a driving-testing circuit 462, and the receiving-testing-metal-pad unit 461 is coupled to the receiving-metal-pad unit 430.

When the transmitter 420 receives the driving-testing signal DT, the transmitter 420 transmits the transmission-testing-coupling signal TC1 through the transmission-metal-pad unit 410 according to the driving-testing signal DT, the driving-testing circuit 462 receives the transmission-testing-coupling signal TC1 through the transmission-testing-metal-pad unit 451, and the testing circuit 452 outputs the transmission-testing signal TS according to the transmission-testing-coupling signal TC1. When the driving-testing circuit 462 receives the driving-testing signal DT, the driving-testing circuit 462 transmits the receiving-testing-coupling signal TC2 through the receiving-testing-metal-pad unit 461 according to the driving-testing signal DT, the receiver 440 receives the receiving-testing-coupling signal TC2 through the receiving-metal-pad unit 430 and outputs the receiving-testing signal RS according to the receiving-testing-coupling signal TC2.

As shown in FIG. 4, for capacitive coupling connection of a single chip, usually the transmitter 420 and the receiver 440 are included so as to perform signal transmission with another chip. The transmitter 420 and the receiver 440 are connected with the transmission-metal-pad unit 410 and the receiving-metal-pad unit 430 so as to transmit and receive signals to and from the another chip through the transmission-metal-pad unit 410 and the receiving-metal-pad unit 430. In this embodiment, the transmitter 420 and the receiver 440 are connected with the corresponding testing units 450 and 460, so as to test whether the chip 40 performs normal signal transmission and achieve chip self testing.

Figure 5:
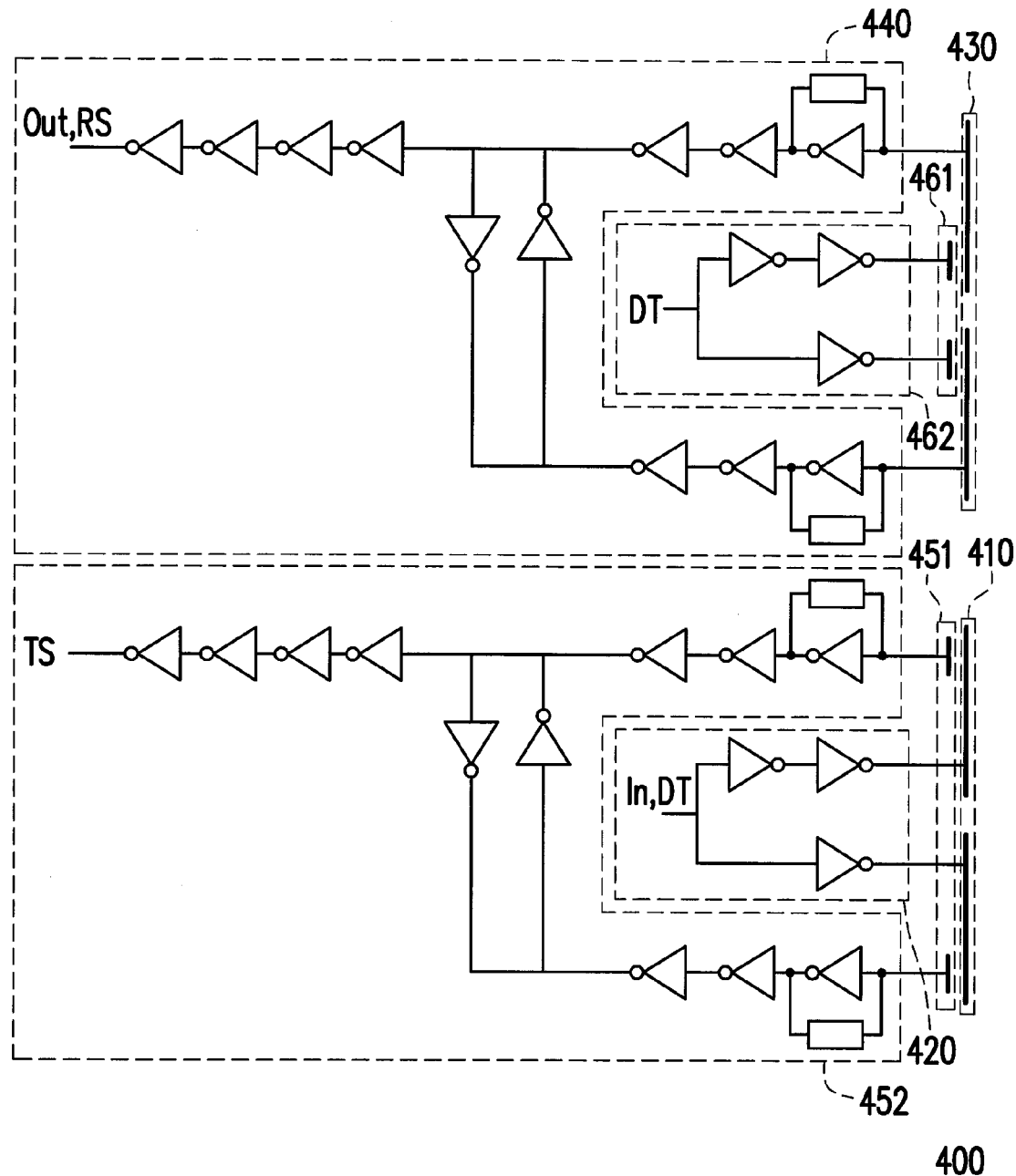
FIG. 5 is a circuit diagram illustrating a chip-to-chip capacitive coupling transmission circuit according to an embodiment of the invention.

FIG. 5 is a circuit diagram illustrating a chip-to-chip capacitive coupling transmission circuit according to an embodiment of the invention, which corresponds to the embodiment of FIG. 4. Referring to FIG. 4 and FIG. 5, a chip-to-chip capacitive coupling transmission circuit 400 includes the transmission-metal-pad unit 410, the transmitter 420, the receiving-metal-pad unit 430, the receiver 440, and testing circuits 452 and 462. It should be noted that the transmitter 420 and the receiver 440 of this embodiment adopt the designs of differential double-pulse transmission circuit and differential double-pulse receiving circuit. Therefore, both the transmission-metal-pad unit 410 and the receiving-metal-pad unit 430 include two metal pads for transmitting and receiving a differential signal of two ends, as shown in FIG. 5. Moreover, the transmission-testing-metal-pad unit 451 and the receiving-testing-metal-pad unit 461 respectively include two metal pads that correspond to the metal pads of the transmission-metal-pad unit 410 and the receiving-metal-pad unit 430.

The transmission-metal-pad unit 410, the transmitter 420, the receiving-metal-pad unit 430, the receiver 440, and the testing circuits 452 and 462 are the same as or similar to the transmission-metal-pad unit 110, the transmitter 120, the receiving-metal-pad unit 210, the receiver 220, and the testing units 130 and 230, and thus may be implemented or operated with reference to the descriptions of FIG. 1 to FIG. 4. Therefore, details thereof will not be repeated hereinafter. It is worth mentioning that, from another perspective, the testing circuit 452 may serve as one of the receivers corresponding to the transmitter 420, and the signal transmission therebetween is performed through the transmission metal pad 410 and the transmission-testing-metal-pad unit 451, so as to achieve self testing. The receiver 440 serves as one of the receivers corresponding to the driving-testing circuit 462, and the signal transmission therebetween is performed through the receiving metal pad 430 and the transmission-testing-metal-pad unit 461, so as to achieve self testing.

In addition, the transmitter and receiver used in the invention for transmitting and receiving signals have circuit area that is sufficiently small in comparison with the metal pads of the chip and therefore is easily applicable to the communication transmission between chips.

In conclusion of the above, the invention provides a chip-to-chip signal transmission system that uses the metal pads in the chip as the capacitive electrodes for capacitive coupling connection and transmits and receives signals between chips by capacitive coupling. With the two-ended differential data signals required for high-speed input and output, communication performance and communication efficiency between the chips are enhanced. Moreover, the chip-to-chip capacitive coupling transmission circuit of the invention further includes testing circuits respectively at the transmission end and the receiving end, which not only shorten the distance between the chips to greatly improve communication quality but also achieve self testing to solve the problem that it is difficult to test a coupling capacitive board with a probe.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A chip-to-chip signal transmission system, comprising:
   a first chip, comprising:
   a transmission-metal-pad unit disposed on a surface of the first chip;
   a transmitter coupled to the transmission-metal-pad unit, receiving input data, and outputting a chip-to-chip coupling signal through the transmission-metal-pad unit; and
   a first testing unit comprising a transmission-testing-metal-pad unit and a receiving-testing circuit, and the transmission-testing-metal-pad unit being coupled to the transmission-metal-pad unit;
   a second chip disposed above the first chip and comprising:
   a receiving-metal-pad unit disposed on a surface of the second chip corresponding to the transmission-metal-pad unit;
   a receiver coupled to the receiving-metal-pad unit, receiving the chip-to-chip coupling signal through the receiving-metal-pad unit, and outputting an output signal; and
   a second testing unit comprising a receiving-testing-metal-pad unit and a driving-testing circuit, and the receiving-testing-metal-pad unit being coupled to the receiving-metal-pad unit; and
   a dielectric layer disposed between the first chip and the second chip,
   wherein, when the transmitter receives a driving-testing signal, the transmitter transmits a transmission-testing-coupling signal through the transmission-testing-metal-pad unit according to the driving-testing signal, the first testing unit receives the transmission-testing-coupling signal through the transmission-metal-pad unit, and the first testing unit outputs a transmission-testing signal according to the transmission-testing-coupling signal; and
   when the second testing unit receives the driving-testing signal, the second testing unit transmits a receiving-testing-coupling signal through the receiving-testing-metal-pad unit according to the driving-testing signal, the receiver receives the receiving-testing-coupling signal through the receiving-metal-pad unit, and the receiver outputs a receiving-testing signal according to the receiving-testing-coupling signal,
   wherein the transmission-metal-pad unit comprises a first transmission metal pad and a second transmission metal pad, and the transmitter comprises:
   a first inverter, an input terminal of the first inverter receiving the input data;
   a second inverter, an input terminal of the second inverter being coupled to an output terminal of the first inverter, and an output terminal of the second inverter being coupled to the first transmission metal pad and outputting the chip-to-chip coupling signal through the first transmission metal pad; and
   a third inverter, an input terminal of the third inverter receiving the input data, and an output terminal of the third inverter being coupled to the second transmission metal pad and outputting the chip-to-chip coupling signal through the second transmission metal pad.

2. The chip-to-chip signal transmission system according to claim 1, wherein the receiving-metal-pad unit comprises a first receiving metal pad and a second receiving metal pad, and the receiver comprises:
   an amplifier circuit coupled to the first receiving metal pad and the second receiving metal pad, receiving the chip-to-chip coupling signal through the first receiving metal pad and the second receiving metal pad, and outputting an amplified coupling signal;
   a double-phase-to-single-phase circuit coupled to the amplifier circuit, receiving the amplified coupling signal, and outputting a single-phase signal; and
   a buffer circuit coupled to the double-phase-to-single-phase circuit, receiving the single-phase signal, and outputting the output signal.

3. The chip-to-chip signal transmission system according to claim 2, wherein the amplifier circuit comprises:
   a first active load circuit coupled to the first receiving metal pad;
   a second active load circuit coupled to the second receiving metal pad;
   a fourth inverter, an input terminal of the fourth inverter being coupled to the first active load circuit;
   a fifth inverter, an input terminal of the fifth inverter being coupled to an output terminal of the fourth inverter;
   a sixth inverter, an input terminal of the sixth inverter being coupled to the second active load circuit; and
   a seventh inverter, an input terminal of the seventh inverter being coupled to an output terminal of the sixth inverter.

4. The chip-to-chip signal transmission system according to claim 3, wherein the double-phase-to-single-phase circuit comprises:
   an eighth inverter, an input terminal of the eighth inverter being coupled to an output terminal of the seventh inverter, and an output terminal of the eighth inverter being coupled to an output terminal of the fifth inverter; and
   a ninth inverter, an input terminal of the ninth inverter being coupled to the output terminal of the fifth inverter, and an output to urinal of the ninth inverter being coupled to the output terminal of the seventh inverter.

5. The chip-to-chip signal transmission system according to claim 4, wherein the buffer circuit comprises:
   a plurality of inverters, wherein the inverters are connected with each other in series.

6. The chip-to-chip signal transmission system according to claim 1, wherein the transmission-testing-metal-pad unit comprises a first transmission-testing-metal pad and a second transmission-testing-metal pad, and the receiving-testing circuit comprises:
   an amplifier circuit coupled to the first transmission-testing-metal pad and the second transmission-testing-metal pad, receiving the transmission-testing-coupling signal through the first transmission-testing-metal pad and the second transmission-testing-metal pad, and outputting an amplified transmission-testing-coupling signal;
   a double-phase-to-single-phase circuit coupled to the amplifier circuit, receiving the amplified transmission-testing-coupling signal, and outputting a single-phase-testing signal; and a buffer circuit coupled to the double-phase-to-single-phase circuit, receiving the single-phase-testing signal, and outputting the transmission-testing signal.

7. The chip-to-chip signal transmission system according to claim 6, wherein the amplifier circuit comprises:
   a first active load circuit coupled to the first transmission-testing-metal pad;
   a second active load circuit coupled to the second transmission-testing-metal pad;
   a first inverter, an input terminal of the first inverter being coupled to the first active load circuit;
   a second inverter, an input terminal of the second inverter being coupled to an output terminal of the first inverter;
   a third inverter, an input terminal of the third inverter being coupled to the second active load circuit; and
   a fourth inverter, an input terminal of the fourth inverter being coupled to an output terminal of the third inverter.

8. The chip-to-chip signal transmission system according to claim 7, wherein the double-phase-to-single-phase circuit comprises:
   a fifth inverter, an input terminal of the fifth inverter being coupled to an output terminal of the fourth inverter, and an output terminal of the fifth inverter being coupled to an output terminal of the second inverter; and
   a sixth inverter, an input terminal of the sixth inverter being coupled to the output terminal of the second inverter, and an output terminal of the sixth inverter being coupled to the output terminal of the fourth inverter.

9. The chip-to-chip signal transmission system according to claim 8, wherein the buffer circuit comprises:
   a plurality of inverters, wherein the inverters are connected with each other in series.

10. The chip-to-chip signal transmission system according to claim 1, wherein the receiving-testing-metal-pad unit comprises a first receiving-testing-metal pad and a second receiving-testing-metal pad, and the driving-testing circuit comprises:
    a seventh inverter, an input terminal of the seventh inverter receiving the driving-testing signal;
    an eighth inverter, an input terminal of the eighth inverter being coupled to an output terminal of the seventh inverter, and an output terminal of the eighth inverter being coupled to the first receiving-testing-metal pad and outputting the receiving-testing-coupling signal through the first receiving metal pad; and
    a ninth inverter, an input terminal of the ninth inverter receiving the driving-testing signal, and an output terminal of the ninth inverter being coupled to the second transmission-testing-metal pad and outputting the receiving-testing-coupling signal through the second transmission metal pad.

11. A chip-to-chip capacitive coupling transmission circuit, disposed on a chip, the chip-to-chip capacitive coupling transmission circuit comprising:
    a transmission-metal-pad unit disposed on a surface of the chip;
    a transmitter coupled to the transmission-metal-pad unit, receiving input data, and outputting a first chip-to-chip coupling signal through the transmission-metal-pad unit;
    a receiving-metal-pad unit disposed on the surface of the chip;
    a receiver coupled to the receiving-metal-pad unit, receiving a second chip-to-chip coupling signal through the receiving-metal-pad unit, and outputting an output signal;
    a first testing unit comprising a transmission-testing-metal-pad unit and a receiving-testing circuit, and the transmission-testing-metal-pad unit being coupled to the transmission-metal-pad unit; and
    a second testing unit comprising a receiving-testing-metal-pad unit and a driving-testing circuit, and the receiving-testing-metal-pad unit being coupled to the receiving-metal-pad unit,
    wherein, when the transmitter receives a driving-testing signal, the transmitter transmits a transmission-testing-coupling signal through the transmission-metal-pad unit according to the driving-testing signal, the first testing unit receives the transmission-testing-coupling signal through the transmission-testing-metal-pad unit, and the first testing unit outputs a transmission-testing signal according to the transmission-testing-coupling signal; and
    when the second testing unit receives the driving-testing signal, the second testing unit transmits a receiving-testing-coupling signal through the receiving-testing-metal-pad unit according to the driving-testing signal, the receiver receives the receiving-testing-coupling signal through the receiving-metal-pad unit, and the receiver outputs a receiving-testing signal according to the receiving-testing-coupling signal,
    wherein the transmission-metal-pad unit comprises a first transmission metal pad and a second transmission metal pad, and the transmitter comprises:
    a first inverter, an input terminal of the first inverter receiving the input data;
    a second inverter, an input terminal of the second inverter being coupled to an output terminal of the first inverter, and an output terminal of the second inverter being coupled to the first transmission metal pad and outputting the first chip-to-chip coupling signal through the first transmission metal pad; and
    a third inverter, an input terminal of the third inverter receiving the input data, and an output terminal of the third inverter being coupled to the second transmission metal pad and outputting the first chip-to-chip coupling signal through the second transmission metal pad.

12. The chip-to-chip capacitive coupling transmission circuit according to claim 11, wherein the receiving-metal-pad unit comprises a first receiving metal pad and a second receiving metal pad, and the receiver comprises:
    an amplifier circuit coupled to the first receiving metal pad and the second receiving metal pad, receiving the second chip-to-chip coupling signal through the first receiving metal pad and the second receiving metal pad, and outputting an amplified coupling signal;
    a double-phase-to-single-phase circuit coupled to the amplifier circuit, receiving the amplified coupling signal, and outputting a single-phase signal; and
    a buffer circuit coupled to the double-phase-to-single-phase circuit, receiving the single-phase signal, and outputting the output signal.

13. The chip-to-chip capacitive coupling transmission circuit according to claim 12, wherein the amplifier circuit comprises:
    a first active load circuit coupled to the first receiving metal pad;
    a second active load circuit coupled to the second receiving metal pad;
    a fourth inverter, an input terminal of the fourth inverter being coupled to the first active load circuit;
    a fifth inverter, an input terminal of the fifth inverter being coupled to an output terminal of the fourth inverter;

a sixth inverter, an input terminal of the sixth inverter being coupled to the second active load circuit; and a seventh inverter, an input terminal of the seventh inverter being coupled to an output terminal of the sixth inverter.

14. The chip-to-chip capacitive coupling transmission circuit according to claim 13, wherein the double-phase-to-single-phase circuit comprises:

an eighth inverter, an input terminal of the eighth inverter being coupled to an output terminal of the seventh inverter, and an output terminal of the eighth inverter being coupled to an output terminal of the fifth inverter; and a ninth inverter, an input terminal of the ninth inverter being coupled to the output terminal of the fifth inverter, and an output terminal of the ninth inverter being coupled to the output terminal of the seventh inverter.

15. The chip-to-chip capacitive coupling transmission circuit according to claim 14, wherein the buffer circuit comprises:

a plurality of inverters, wherein the inverters are connected with each other in series.

16. The chip-to-chip capacitive coupling transmission circuit according to claim 11, wherein the transmission-testing-metal-pad unit comprises a first transmission-testing-metal pad and a second transmission-testing-metal pad, and the receiving-testing circuit comprises:

an amplifier circuit coupled to the first transmission-testing-metal pad and the second transmission-testing-metal pad, receiving the transmission-testing-coupling signal through the first transmission-testing-metal pad and the second transmission-testing-metal pad, and outputting an amplified transmission-testing-coupling signal;

a double-phase-to-single-phase circuit coupled to the amplifier circuit, receiving the amplified transmission-testing-coupling signal, and outputting a single-phase-testing signal; and a buffer circuit coupled to the double-phase-to-single-phase circuit, receiving the single-phase-testing signal, and outputting the transmission-testing signal.

17. The chip-to-chip capacitive coupling transmission circuit according to claim 16, wherein the amplifier circuit comprises:

a first active load circuit coupled to the first transmission-testing-metal pad;

a second active load circuit coupled to the second transmission-testing-metal pad;

a first inverter, an input terminal of the first inverter being coupled to the first active load circuit;

a second inverter, an input terminal of the second inverter being coupled to an output terminal of the first inverter;

a third inverter, an input terminal of the third inverter being coupled to the second active load circuit; and a fourth inverter, an input terminal of the fourth inverter being coupled to an output terminal of the third inverter.

18. The chip-to-chip capacitive coupling transmission circuit according to claim 17, wherein the double-phase-to-single-phase circuit comprises:

a fifth inverter, an input terminal of the fifth inverter being coupled to an output terminal of the fourth inverter, and an output terminal of the fifth inverter being coupled to an output terminal of the second inverter; and a sixth inverter, an input terminal of the sixth inverter being coupled to the output terminal of the second inverter, and an output terminal of the sixth inverter being coupled to the output terminal of the fourth inverter.

19. The chip-to-chip capacitive coupling transmission circuit according to claim 18, wherein the buffer circuit comprises:

a plurality of inverters, wherein the inverters are connected with each other in series.

20. The chip-to-chip capacitive coupling transmission circuit according to claim 19, wherein the receiving-testing-metal-pad unit comprises a first receiving-testing-metal pad and a second receiving-testing-metal pad, and the driving-testing circuit comprises:

a seventh inverter, an input terminal of the seventh inverter receiving the driving-testing signal;

an eighth inverter, an input terminal of the eighth inverter being coupled to an output terminal of the seventh inverter, and an output terminal of the eighth inverter being coupled to the first receiving-testing-metal pad and outputting the receiving-testing-coupling signal through the first receiving metal pad; and a ninth inverter, an input terminal of the ninth inverter receiving the driving-testing signal, and an output terminal of the ninth inverter being coupled to the second transmission-testing-metal pad and outputting the receiving-testing-coupling signal through the second transmission metal pad.

* * * * *